United States Patent [19]

Kudo et al.

[11] 4,316,764
[45] Feb. 23, 1982

[54] METHOD FOR HORIZONTAL RIBBON CRYSTAL GROWTH

[75] Inventors: Bosshi Kudo, Nagareyama; Masamichi Yoshioka, Yoshikawa, both of Japan

[73] Assignee: The Agency of Industrial Science and Technology, Tokyo, Japan

[21] Appl. No.: 100,541

[22] Filed: Dec. 5, 1979

[30] Foreign Application Priority Data

Dec. 9, 1978 [JP] Japan ................................ 53-153005

[51] Int. Cl.³ ........................ C30B 15/06; C30B 15/14
[52] U.S. Cl. ........................ 156/617 H; 156/DIG. 88; 156/DIG. 97; 422/249
[58] Field of Search ............. 156/608, 617 H, 617 SP, 156/DIG. 64, DIG. 88, DIG. 97; 75/135, 143; 65/33; 422/246, 249

[56] References Cited

U.S. PATENT DOCUMENTS

| 2,822,308 | 2/1958 | Hall | 422/249 |
| 3,370,927 | 2/1968 | Faust, Jr. | 156/DIG. 97 |

FOREIGN PATENT DOCUMENTS

| 2633961 | 2/1977 | Fed. Rep. of Germany | 156/DIG. 97 |
| 1248007 | 9/1971 | United Kingdom | 422/249 |

OTHER PUBLICATIONS

Tolksdorf and Welz, Crystal Growth of Magnetic Garnets, Published in Crystals by Springer-Verlag, N.Y., pp. 24–29, Jun. 1978.

*Primary Examiner*—Gregory N. Clements
*Attorney, Agent, or Firm*—Kane, Dalsimer, Kane, Sullivan and Kurucz

[57] ABSTRACT

A method for growing a thin and flat ribbon-like crystal of crystalline substance, wherein a seed crystal is contacted with horizontal free surface of melt of crystalline substance raised up to the level beyond the upper edge of a crucible, thereafter the contact interface between said seed crystal or a successively growing crystal and the melt (the solid-liquid interface) is cooled under freezing point of said crystalline substance, thereby the crystal is made to successively grow on said solid-liquid interface, while said seed crystal and said successively growing crystal is drawn out substantially in horizontal direction, wherein an outwardly projecting eaves-structure is formed on at least a part of an upper peripheral wall of said crucible, said melt of crystalline substance is guided to said eaves-structure, which is then heated, thereby the generation of recrystallization on upper face of the melt contacting with the upper portion of the peripheral wall of the crucible is prevented, and high cooling effect for the solid-liquid interface can be retained as well.

4 Claims, 3 Drawing Figures

METHOD FOR HORIZONTAL RIBBON CRYSTAL GROWTH

BACKGROUND OF THE INVENTION

1. Field of the Invention

This invention relates to an improved method for horizontal ribbon crystal growth and more particularly relates to a method for preventing recrystallization which is apt to occur in the melt of a crystalline substance upon contact with the upper peripheral wall of a melt crucible.

2. Description of the Prior Art

There is known a method for conducting a horizontal ribbon crystal growth wherein crystalline substance, for instance semiconductor silicon or the like is heated in a refractory crucible by means of a heater to make melt. The melt is raised up to the level beyond the upper edge of the crucible and from the horizontal free surface of said melt a sheet-like crystal is grown at the growing tip of a seed crystal. The crystal is drawn out in a horizontal direction.

In such a method for crystal growth, there are two technical problems. One of the problems is to enhance the cooling effect, when the contact intersurface (hereinafter referred to as the solid-liquid interface) between the seed crystal or the successively growing crystal and the melt is cooled by cooling gas from a cooler arranged above said interface. The other problem is to prevent recrystallization, which is apt to be caused on the upper surface of the melt contacting with the upper portion of a peripheral wall of a crucible and where heat radiation takes place in large quantity.

Should the upper end edge of the crucible be positioned lower than the upper surface of the melt, the desired cooling effect problem will be attained. However, such cooling induces the generation of recrystallization at a position adjacent to the upper portion of the peripheral wall of the crucible.

Should a heater for heating the upper portion of the outer peripheral wall of the crucible be arranged outside or inside of the peripheral wall, recrystallization can be prevented. However the cooling effect for the solid-liquid interface is reduced.

FIG. 1 is a vertical sectional view schematically showing a state when a ribbon crystal is being drawn out according to the prior art. Surface of melt 1 of high purity silicon is held to a level raised up from the upper edge of a high purity quartz crucible 4. On the horizontal free surface 1a of this melt 1, a seed crystal 3 is contacted with melt to adapt thereto. Thereafter by increasing the flow rate of gas of a cooler 8 arranged above the crystal growth part, the cooling of the solid-liquid interface between the seed crystal 3 and the melt 1 is intensified so as to become undercooled. Thereby a ribbon crystal 2 is grown and horizontally drawn out in the direction opposite to the direction of crystal growth by means of a drawing mechanism (not shown) pulling the seed crystal 3 with the same velocity as its growing rate.

In the method shown in FIG. 1, a heater 7 surrounds almost the whole periphery of a peripheral wall 5a of a crucible 5 made of high purity graphite holding said crucible 4 and covers only the peripheral portion of a bottom portion 5b of the crucible 5 and does not heat the central portion of the bottom portion 5b. And, the upper end edge of this heater 7 is positioned lower than the upper surface 1a of the melt 1.

Above this heater 7, another heater 6 is arranged, and 9 is a heat shield plate.

In this arrangement, when electric power is supplied to the heater 7 only, the cooling effect for the solid-liquid interface can be enhanced because the heating for the upper portion of the melt is weak. The circulating convection caused in the melt 1 within the crucible 4 is shown by broken lines in FIG. 1. Namely, the melt 1 is heated by the heater 7 at a place near the peripheral wall 4a of the crucible 4 and its density becomes smaller, so that it ascends along peripheral wall 4a. Thereafter it flows along the upper surface 1a of the melt 1 towards the central portion, and in this course it flows underside of the solid-liquid intersurface, where it is cooled by cooling gas to increase its density so that it descends and reaches the bottom portion 4b of the crucible 4. Thereafter it flows from the central portion of this bottom portion towards the peripheral portion.

Due to the flow of the melt underside of the solid-liquid interface, the crystal growth in depth direction of the melt can be prevented. However, as mentioned above, in case electric power is supplied to the heater 7 only, the recrystallization of melt 1 occurs at a place adjacent to the upper portion of the peripheral wall 4a.

On the other hand, when electric power is supplied to the heater 6 as well as to heater 7, recrystallization can be prevented. However, the cooling effect for the solid-liquid interface is weakened. Further, in this case, the circulating melt as shown by the broken lines will not occur, because the temperature of the melt contacting with the upper portion of the peripheral wall 4a of the crucible becomes higher than the temperature of the melt contacting with the lower portion of the peripheral wall 4a and the density of the melt of this upper portion becomes less than that of the lower portion. Thus any force to upwardly drive the melt along the peripheral wall 4a will not occur. Consequently, crystal growth in the depth direction of the melt will occur.

SUMMARY OF THE INVENTION

The main object of this invention is to provide a method for horizontal ribbon crystal growth, wherein recrystallization of the melt at the upper portion of the peripheral wall of the crucible can be prevented, and the cooling effect for the solid-liquid interface can be improved.

In order to attain the above object, at least a part of the upper portion of a peripheral wall of a crucible is provided with an eaves structure projecting outside, to which the melt of crystalline substance is guided. The eaves structure is heated. When the method of this invention is applied to a melt wherein there is a circulating convection induced by way of decreasing the heat of the central portion at the bottom of the crucible than that of the peripheral portion of the bottom, said circulating convection is retained. Thereby, crystal growth in the depth direction of the melt is prevented.

DETAILED DESCRIPTION OF THE INVENTION

Figure 1:
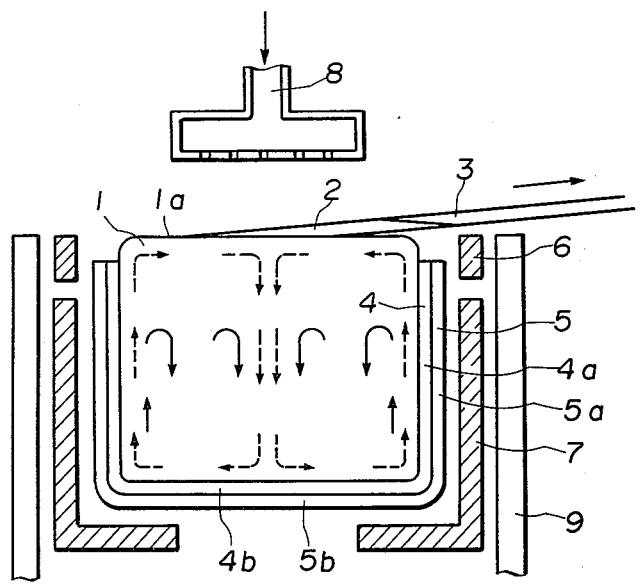
FIG. 1 is a vertical sectional view showing a conventional method of the prior art.
Figure 2:
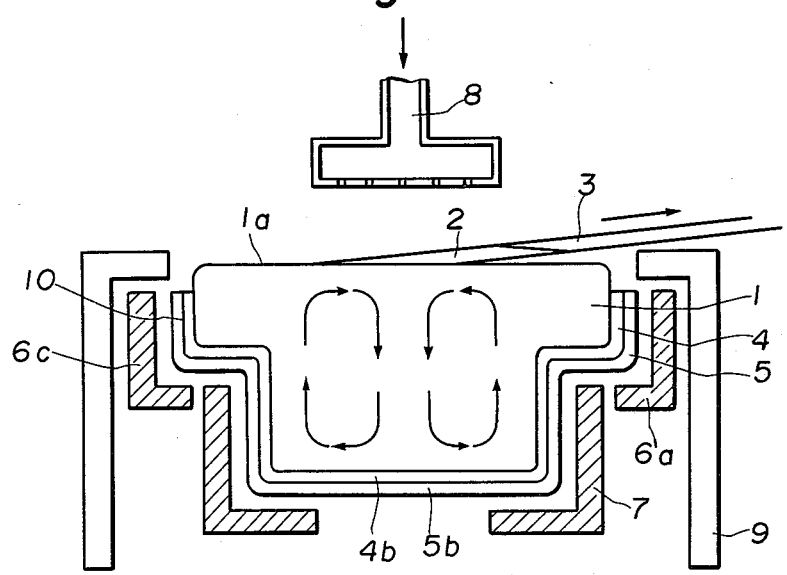
FIG. 2 is a vertical sectional view showing an embodiment according to this invention.
Figure 3:
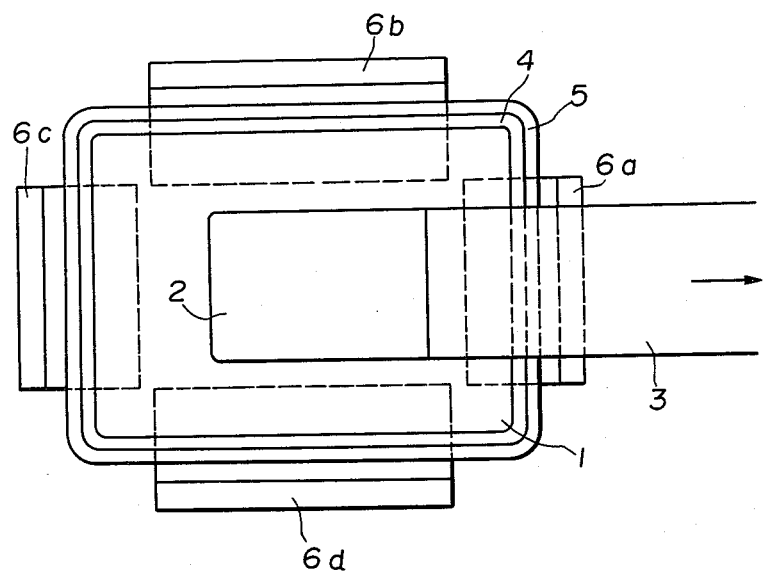
FIG. 3 is a plan view of FIG. 2.

An embodiment of this invention will be described in detail with reference to FIG. 2 and FIG. 3 as follows. FIG. 2 is a vertical sectional view schematically showing a state when a ribbon crystal is drawn out, and FIG. 3 is a plan view of FIG. 2. High purity silicon melt 1 is held by a high purity quartz crucible 4 so that the surface of melt is raised up as usual, however, said crucible 4 is provided with an eaves-structure 10 projecting outside, on its peripheral wall 4a. The reason therefor will be described later.

Heaters 6a, 6b, 6c and 6d are provided so as to locally heat said eaves-structure 10. As usual, a seed crystal 3 is contacted with the horizontal free surface 1a of the melt 1 and adapted thereto. Thereafter the cooling effect of a cooler 8 is intensified to lower the temperature of surface 1a of the melt 1 and a ribbon crystal 2 is made to grow.

The upper end of the peripheral wall 4a is heated by the heaters 6a, 6b, 6c and 6d, and recrystallization in the melt contacting with the peripheral wall 4a is prevented. The upper portion of peripheral wall 4a is formed into the eaves-structure 10, and is sufficiently spaced from the solid-liquid interface where the crystal growth is effected. Accordingly, when the upper portion of the peripheral wall 4a, i.e. the eaves-structure 10, is heated, the cooling effect by the cooling gas for the solid-liquid interface will not be adversely affected. In result, the crystal growth is smoothly effected under satisfactory conditions. Further, the temperature of the upper portion of the melt 1 far above the peripheral portion of the bottom 4b can be retained in a lower state than that of the peripheral portion of the bottom 4b, because it is less influenced by the heat from the heaters 6a–6d. Therefore, since there is caused the ascent of the melt along the peripheral wall, circulating convection can be effected, as shown by the stream diagrammed in FIG. 2. High temperature melt flows underside of the solid-liquid interface, thus the down-growth of crystal can be prevented.

In the above embodiment, the eaves-structure is formed on the whole periphery of the crucible. However, this invention is not limited within the scope of this embodiment, but it is also within the invention that said eaves-structure may be formed only at a place corresponding to the place of drawing-out of the ribbon crystal. And, in case of high speed growth a crystal is effected; the recrystallization is apt to be caused not only at a place corresponding to the drawing-out at the peripheral wall of the crucible, but also at other places, i.e. a place corresponding to the side portions of the crucible. Thus it is also advantageous to form the eaves-structure at these places.

In an embodiment of the invention, it is effective when the eaves-structure of a crucible is formed with a projection of 30–40 mm length and 10–20 mm height. But this dimension is by no means limited but may be suitably selected within a range to satisfy the gist of this invention.

What is claimed is:

1. In a method for growing a thin, flat, ribbon-like crystal from a melt of crystalline material, which comprises;

providing a crucible having an open top end defined by a peripheral edge, a closed bottom end, a peripheral wall joining the top and bottom ends and heating means for maintaining a crystalline material charge in a melt form, circulating by convection so as to ascend along the peripheral wall, flow toward the center of the crucible at the top of the melt, descends to the bottom of the crucible beneath the solid-liquid interface described hereinafter and then flows toward the peripheral wall along the bottom of the crucible;

charging the crucible with a melt of the crystalline material, to a level above the peripheral edge;

contacting the upper surface of the melt with a seed crystal, whereby there is formed a solid-liquid interface between the melt and the seed crystal;

cooling the solid-liquid interface beneath the melting point of the crystalline material, whereby crystal grows at the interface;

drawing the growing crystal from the interface continuously, in a substantially horizontal direction;

the improvement, which comprises;

in providing the crucible, said crucible also having an expanded upper portion of the peripheral wall including the peripheral edge, projecting outwardly beyond a lower portion of the peripheral wall, said expanded upper portion defining a peripheral zone of the crucible; and additionally providing means for maintaining the charge melt within the peripheral zone of the crucible in a state of melt whereby no recrystallization occurs in said zone.

2. The method of claim 1 wherein said expanded upper portion is on the side of the crucible from which the growing crystal is drawn.

3. The method of claim 1 wherein said expanded upper portion is on the side of the crucible from which the growing crystal is drawn and also on the side opposite to the side from which the growing crystal is drawn.

4. The method of claim 1 wherein the means for maintaining is a heater.

* * * * *